(12) United States Patent
Borschel (10) Patent No.: US 10,814,361 B2
(45) Date of Patent: Oct. 27, 2020

(54) PARTICLE BEAM APPARATUS AND METHOD FOR OPERATING A PARTICLE BEAM APPARATUS

(71) Applicant: VISTEC ELECTRON BEAM GMBH, Jena (DE)

(72) Inventor: Christian Borschel, Jena (DE)

(73) Assignee: VISTEC ELECTRON BEAM GMBH (DE)

( * ) Notice: Subject to any disclaimer, the term of this patent is extended or adjusted under 35 U.S.C. 154(b) by 1078 days.

(21) Appl. No.: 15/185,724

(22) Filed: Jun. 17, 2016

(65) Prior Publication Data
US 2016/0368031 A1 Dec. 22, 2016

(30) Foreign Application Priority Data

Jun. 17, 2015 (DE) .......................... 10 2015 211 090

(51) Int. Cl.
*B08B 7/04* (2006.01)
*H01J 37/02* (2006.01)
(Continued)

(52) U.S. Cl.
CPC .................. *B08B 7/04* (2013.01); *B08B 5/00* (2013.01); *B08B 7/005* (2013.01); *H01J 37/02* (2013.01);
(Continued)

(58) Field of Classification Search
CPC .. B08B 5/00; B08B 7/005; B08B 7/04; G01S 13/62; G01S 13/92; G08G 1/056;
(Continued)

(56) References Cited

U.S. PATENT DOCUMENTS 5,312,519 A * 5/1994 Sakai .................... B08B 7/0035
134/1
6,098,637 A * 8/2000 Parke .................. C23C 16/4405
118/50.1
(Continued)

FOREIGN PATENT DOCUMENTS

CN 101207265 A 6/2008
DE 100 57 079 5/2001
(Continued)

OTHER PUBLICATIONS

European Search Report issued in European Patent Application No. 16 172 771.4, dated Nov. 10, 2016.
(Continued)

*Primary Examiner* — Nadine G Norton
*Assistant Examiner* — Christopher Remavege
(74) *Attorney, Agent, or Firm* — Carter, DeLuca & Farrell LLP (57) ABSTRACT

In a particle beam apparatus and a method for operating a particle beam apparatus, the particle beam apparatus has a column having a particle-beam optical system for generating a particle beam, to thereby expose a desired pattern in a vacuum sample chamber in an exposure operation. In a cleaning operation, a regulable gas stream having photodissociatable gas is fed to the column and/or the vacuum sample chamber via a gas-feed system. The photodissociation of the supplied gas is brought about in the cleaning operation with the aid of a plurality of light sources distributed spatially in the column and/or in the vacuum sample chamber. In the cleaning operation, individual light sources are able to be switched on and off selectively with respect to time via a control unit connected to the light sources, in order to clean individual elements in the column and/or in the vacuum sample chamber in targeted fashion.

19 Claims, 3 Drawing Sheets

(51) Int. Cl.
*H01J 37/317* (2006.01)
*B08B 5/00* (2006.01)
*B08B 7/00* (2006.01)
*H01J 37/18* (2006.01)

(52) U.S. Cl.
CPC .......... *H01J 37/18* (2013.01); *H01J 37/3174* (2013.01); *H01J 2237/022* (2013.01); *H01J 2237/1825* (2013.01); *H01J 2237/31793* (2013.01)

(58) Field of Classification Search
CPC ......... H01J 2237/022; H01J 2237/1825; H01J 2237/31793; H01J 37/02; H01J 37/18; H01J 37/3174
USPC ................................ 250/492.1, 492.2, 492.3
See application file for complete search history.

(56) References Cited

U.S. PATENT DOCUMENTS

| | | | |
|---|---|---|---|
| 6,207,117 B1 | 3/2001 | Takamatsu et al. | |
| 6,281,511 B1* | 8/2001 | Thakur | C23C 16/452 118/50.1 |
| 7,629,578 B2* | 12/2009 | Frosien | B82Y 10/00 250/306 |
| 8,092,641 B1* | 1/2012 | Xiao | H01J 37/02 134/19 |
| 8,492,736 B2* | 7/2013 | Wang | H01L 21/02041 250/504 R |
| 8,507,854 B2 | 8/2013 | Buehler et al. | |
| 2007/0284541 A1* | 12/2007 | Vane | H01J 37/02 250/441.11 |
| 2008/0169433 A1* | 7/2008 | Yasuda | B82Y 10/00 250/492.3 |
| 2008/0212045 A1 | 9/2008 | Bader | |
| 2009/0126124 A1* | 5/2009 | Ahmad | D06B 23/20 8/400 |
| 2011/0079711 A1* | 4/2011 | Buehler | H01J 37/28 250/307 |

FOREIGN PATENT DOCUMENTS

| | | |
|---|---|---|
| DE | 102005031792 A1 | 1/2007 |
| DE | 10 2008 049 655 | 4/2010 |
| DE | 102008049655 A1 | 4/2010 |
| DE | 102009033319 A1 | 2/2011 |
| GB | 2358955 | 8/2001 |
| JP | H11-154640 A | 6/1999 |
| JP | 2001148340 A | 5/2001 |
| TW | 200703486 A | 1/2007 |

OTHER PUBLICATIONS

Wanzenboeck, H. et al., "Novel method for cleaning a vacuum chamber from hydrocarbon contamination", Journal of Vacuum Science and Technology: Part A, Nov. 1, 2010.

* cited by examiner

PARTICLE BEAM APPARATUS AND METHOD FOR OPERATING A PARTICLE BEAM APPARATUS

CROSS-REFERENCE TO RELATED APPLICATIONS

The present application claims priority to Application No. 10 2015 211 090.7, filed in the Federal Republic of Germany on Jun. 17, 2015, which is expressly incorporated herein in its entirety by reference thereto.

FIELD OF THE INVENTION

The present invention relates to a particle beam apparatus as well as a method for operating a particle beam apparatus, and in particular, a possibility for cleaning such apparatuses.

BACKGROUND INFORMATION

Conventional particle beam apparatuses, e.g., electron beam apparatus, include a column having a particle-beam optical system in order to thereby expose a desired pattern in a vacuum sample chamber in an exposure operation. In the course of the operating time, organic contaminants deposit on surfaces of components in the column and/or the vacuum sample chamber, e.g., on diaphragms or on electrodes of electrostatic deflection systems. For example, these contaminants come from the lacquers, necessary for the lithography processes, on the substrates in the vacuum sample chamber. Due to the bombardment with particle rays such as electrons, for example, organic molecules are released from the lacquers, evaporate off, diffuse out of the vacuum sample chamber into the column, and can adsorb on component surfaces in the column. The bombardment with charged particles breaks down and links the molecules, so that solid, high-carbon contamination layers form on the component surfaces, which no longer desorb. The contamination layers exhibit poor electrical conductivity, and may become highly charged because of the primary and secondary electrons impinging on them. The contamination layers then slowly become charged or discharged in response to changing conditions in the column. During exposure operations, the charges changing over time in the contamination layers thus produce electrostatic fields variable over time. Such fields in turn undesirably deflect the particle beam in the column and lead, for example, to uncontrollable drifts of the beam position on the substrate or influence other beam properties in uncontrollable manner. Therefore, in such apparatuses, it is necessary to clean the respective susceptible surfaces in the column or in the vacuum sample chamber at regular intervals, in order to avoid or at least to minimize these negative influences of contaminants. In addition to the time-consuming disassembly and cleaning of respective components, there are various conventional methods for removing corresponding contaminations without having to dismantle the column of the particle beam apparatus.

For example, German Published Patent Application No. 100 57 079 describes introducing ozone into the chambers of the column during the exposure. The bombardment with electrons splits the ozone into oxygen and oxygen radicals. The oxygen radicals then react with soiling on component surfaces in the column and the reaction products thereby resulting are pumped off. This method has the disadvantage that with its use, a spatially targeted cleaning of specific components in the column is almost impossible. Moreover, it is difficult to set a suitable ozone pressure in all areas of the column if, at the same time, the necessary high vacuum must be maintained in exposure operation.

Another type of cleaning method for the column of a particle beam apparatus is described in German Published Patent Application No. 10 2008 049 655 and U.S. Pat. No. 6,207,117. In this method, catalytic materials are applied in the column in the area of the contamination-susceptible components, and an activatable substance is introduced into the column via a gas-feed system. After the introduced substance has been activated via the catalytic materials, the activated substance then interacts with the contamination material present, and the reaction products obtained in the process may be pumped off. In this context, alternatively or as a backup, the introduced substance may be activated by illumination with UV radiation, for which a suitable UV light source is located in or is able to be introduced into the column. A selective removal of contaminants on specific components is almost impossible using this method, as well. For example, the cleaning cannot be controlled locally according to demand.

SUMMARY

Example embodiments of the present invention provide a particle beam apparatus, as well as a method for operating a particle beam apparatus, via which a targeted and efficient cleaning of component surfaces in the column and/or in the vacuum sample chamber of such an apparatus is possible.

According to an example embodiment of the a particle beam apparatus includes: a column which has a particle-beam optical system for generating a particle beam, to expose a desired pattern in a vacuum sample chamber in an exposure operation; a gas-feed system, to feed a regulable gas stream having a photodissociatable gas to the column and/or the vacuum sample chamber in a cleaning operation; a plurality of light sources, which are distributed spatially in the column and/or in the vacuum sample chamber, and photodissociate the supplied gas in the cleaning operation; and a control unit, connected to the light sources, which is arranged such that individual light sources are able to be switched on and off selectively with respect to time in the cleaning operation.

The control unit may be operatively connected with an inlet valve of the gas-feed system, and may be arranged such that by acting on the inlet valve, the gas pressure in the column and/or in the vacuum sample chamber is able to be set in defined fashion in the cleaning operation.

In this connection, a set of parameters may be stored in each instance in the control unit for defined spatial areas of the column and/or of the vacuum sample chamber, the set of parameters containing the parameters necessary for the optimal cleaning of the respective area, and the set of parameters including at least the selection of one or more specific light sources, their on-times, and a specific gas pressure in the column and/or in the vacuum sample chamber.

It is further possible that the vacuum sample chamber is operatively connected with a vacuum pump in order to pump off degradation products resulting from the reaction of the photodissociation products with contaminants, and that between the vacuum sample chamber and the vacuum pump, a conversion unit is disposed that breaks down the residues of photodissociatable gas that are still present in the evacuated gas stream.

A particle beam source may be arranged in the column, a protective diaphragm being disposed in front of the particle-beam source to protect it from a back-diffusion of photodissociation products.

It may be provided that the light sources in the column and/or in the vacuum sample chamber are each situated adjacent to elements that are prone to organic contamination.

The light sources may each take the form of an LED, which emits in the ultraviolet spectral range between 200 nm and 300 nm, for example.

Alternatively, it may also be provided that the plurality of light sources are formed as exit areas of a fiber bundle having a plurality of light-conducting fibers, and are distributed spatially in the column and/or in the vacuum sample chamber, and at the other end of the fiber bundle, a light source is disposed, via which light is coupled into the individual light-conducting fibers of the fiber bundle, and between the light source and the light-conducting fibers, at least one fiber-optic switching unit is located that is operable via the control unit for switching individual light-conducting fibers on and off selectively with respect to time.

Moreover, it is possible that outside of the column, an oxygen reservoir and an ozone generator are disposed, via which, from the oxygen reservoir, ozone is able to be generated as a photodissociatable gas and supplied to the column via the gas-feed system, and by the interaction between the radiation emitted by the light sources and the ozone, oxygen radicals result as photodissociation products which react with contaminants to form degradation products able to be pumped off.

According to an example embodiment of the present invention, a method for operating a corpuscular beam apparatus having a column which includes a particle-beam optical system, to thereby expose a desired pattern in a vacuum sample chamber in an exposure operation, includes: in a cleaning operation for cleaning the column and/or the vacuum sample chamber, feeding a regulable gas stream having a photodissociatable gas via a gas-feed system to the column and/or the vacuum sample chamber; and in the cleaning operation, photodissociating the supplied gas with the aid of a plurality of light sources distributed spatially in the column and/or in the vacuum sample chamber, by switching individual light sources on and off selectively with respect to time via a control unit connected to the light sources.

It is further possible that the control unit is operatively connected with an inlet valve of the gas-feed system, and in the cleaning operation, acts on the inlet valve such that the gas pressure in the column and/or in the vacuum sample chamber is set in defined fashion.

Moreover, it may be provided that in the cleaning operation, the individual light sources are activated over time via the control unit as a function of the soiling in the vicinity of the respective light source.

The particle beam may be switched off during the cleaning operation.

The degradation products resulting from the reaction of the photodissociation products with contaminants may be pumped off via a vacuum pump.

It may additionally be provided that the residues of the photodissociatable gas that are still present in the evacuated gas stream may be broken down.

In the cleaning operation, because of the use of a plurality of light sources able to be switched on and off selectively with respect to time, a defined local cleaning of especially contaminated elements or areas in the column and/or the vacuum sample chamber of the particle beam apparatus may be performed. Disassembly of the overall system is not necessary for this. That is, the standstill time of the apparatus resulting for the cleaning operation may be shortened considerably. Furthermore, because of the possibility created for the defined local cleaning of affected elements, the stress for other uncontaminated components in the column and/or in the vacuum sample chamber may be minimized to a great extent.

The location of the generating of degradation products of the photodissociatable gas and the reach of these degradation products in the column and/or in the vacuum sample chamber may be controlled independently of each other via the control unit. This is accomplished first of all by the defined selection of the light source(s) to be switched on in each case in the cleaning operation, and secondly by the influence on the inlet valve and the pressure thereby adjustable in the column and/or in the vacuum sample chamber. In this manner, optimal parameters may be selected independently of each other for each column section or for each area of the vacuum sample chamber to be cleaned.

Further features and aspects of example embodiments of the present invention are described in more detail below with reference to the appended Figures.

DETAILED DESCRIPTION

A particle beam apparatus according to an example embodiment of the present invention is explained below with reference to FIG. 1, which schematically illustrates the particle beam apparatus.

In this, as well as in the further exemplary embodiments, the particle beam apparatus takes the form of an electron beam apparatus. It should be understood, however, that the particle beam apparatus may be used in connection with other particle-beam systems, such as, for example, ion-beam apparatuses, electron-beam microscopes, etc.

The particle beam apparatus includes a column 10 having a particle-beam optical system for generating a particle beam, or more precisely, an electron beam, to thereby write a desired pattern on a substrate 21 in vacuum sample chamber 20 in an exposure operation. In addition to a particle beam source 11 disposed in column 10, the particle-beam optical system includes, for example, various diaphragms 13.1, 13.2, as well as electrostatic deflector electrodes 14.1 to 14.6, which are illustrated schematically in FIG. 1. Via these elements, the particle beam, generated by particle-beam source 11, is formed and deflected in the exposure operation in column 10 in, for example, a conventional manner.

The particle beam apparatus also includes a gas-feed system that includes a regulable inlet valve 3, and a connecting line between inlet valve 3 and column 10. In a cleaning operation, a regulable gas stream having a photodissociatable gas is fed via the gas-feed system, e.g., to the upper end of column 10 and conducted through column 10. In FIG. 1, the corresponding gas stream in column 10 is indicated as a dotted line. Alternatively, such a gas stream may also be supplied at another location in column 10.

In the present exemplary embodiment, the photodissociatable gas is ozone ($O_3$), which is generated in an ozone generator 2 and is then supplied to the gas-feed system. In this context, to generate ozone, molecular oxygen ($O_2$) is fed from an oxygen reservoir 1 to ozone generator 2, and the ozone is then generated in ozone generator 2 in, for example, a conventional manner, e.g., by dark electrical discharge according to the Siemens principle.

In the cleaning operation, the ozone ($O_3$) fed to column 10 is then photodissociated in column 10 and/or in vacuum sample chamber 20, that is, is split via the local influence of ultraviolet radiation into photodissociation products in the form of oxygen molecules ($O_2$) and oxygen radicals ($O^-$). The oxygen radicals ($O^-$) then act in column 10 and/or in vacuum sample chamber 20 as oxidizers, via which organic high-carbon contaminants on various elements of the system may be decomposed by oxidation. The oxidation reaction between the oxygen radicals ($O^-$) and the organic contaminants results, for example, in carbon dioxide ($CO_2$) and water ($H_2O$) as volatile reaction or degradation products, which enrich the gas stream in column 10, and are ultimately pumped off at the lower end of column 10, e.g., via vacuum sample chamber 20, as illustrated in FIG. 1. The evacuation may also take place at another suitable location in the particle beam apparatus.

In order to protect particle beam source 11 in the column from a back-diffusion of photodissociation products, particularly oxygen radicals ($O^-$), it may be provided to place a protective diaphragm 12 having a narrow diaphragm aperture in front of particle beam source 11. In this manner, a possibly increased wear of particle beam source 11 due to additional oxidation processes may be avoided.

Figure 1:
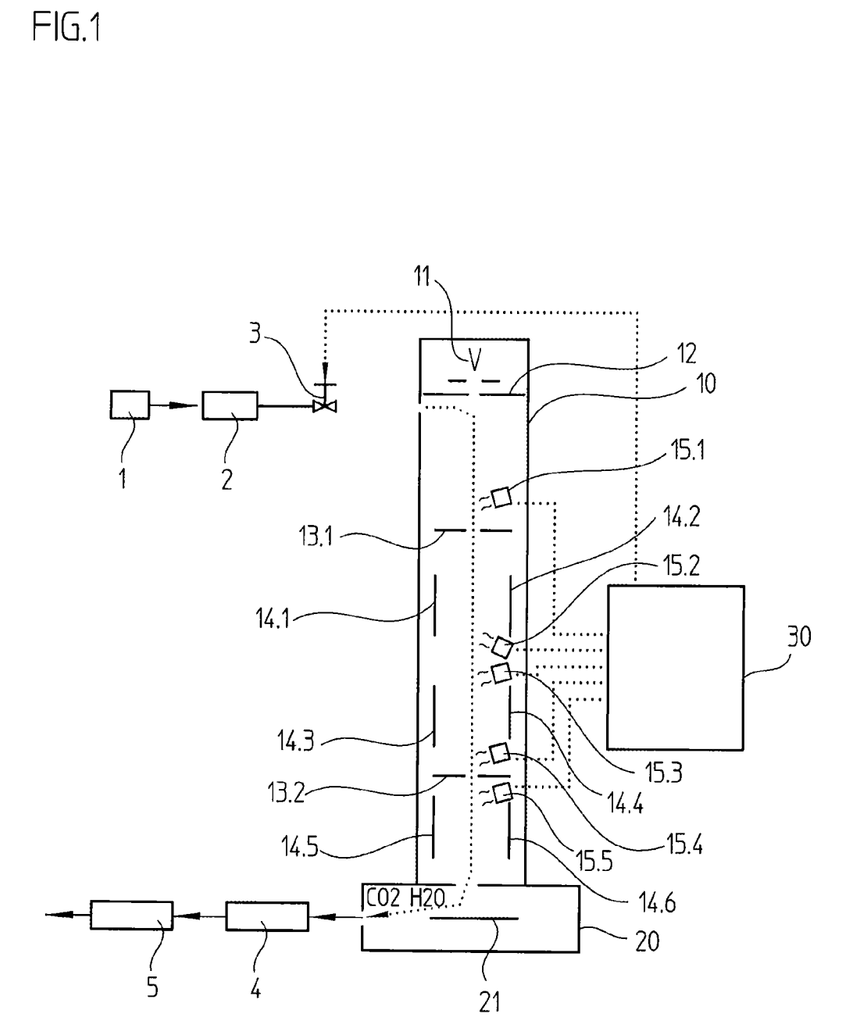
FIG. 1 schematically illustrates a particle beam apparatus according to an example embodiment of the present invention.

To pump off the degradation products carbon dioxide ($CO_2$) and water ($H_2O$) resulting in response to the oxidation, a vacuum pump 5 is used in the cleaning operation, which is illustrated only schematically in FIG. 1. In exposure operation, this pump is used to evacuate the system and to generate the high vacuum required. Typically, combinations of mechanical backing pumps, such as rotary slide-valve pumps or scroll pumps and a turbomolecular pump are used as a suitable vacuum pump 5, that is, as a rule, vacuum pump 5 represents a pump system made up of several individual pumps coordinated with each other.

In the present exemplary embodiment, a conversion unit 4 in the form of an ozone annihilator is also disposed in the evacuated gas stream between vacuum sample chamber 20 and vacuum pump 5. Residues of the photodissociatable gas, or more precisely, ozone ($O_3$) perhaps still present in the evacuated gas stream are degraded via conversion unit 4, in order to avoid environmental and/or health risks. Such a degradation of residual ozone ($O_3$) may be accomplished in conversion unit 4, for example, by irradiation with intensive UV light having a wavelength of 250 nm, or via noble-metal catalysts.

In order to selectively set the gas pressure necessary for the cleaning operation, e.g., in the range between 1 and 100 Pa, in electron-optical column 10 and/or possibly in vacuum sample chamber 20, the necessary—usually small—quantity of the photodissociatable gas ozone ($O_3$) is admitted into column 10 at proper pump power of vacuum pump 5 via controllable inlet valve 3. To that end, inlet valve 3 is operatively connected with control unit 30, which actuates or acts upon inlet valve 3 in suitable manner.

Therefore, in the particle beam apparatus, in addition to the actual exposure operation, a separate cleaning operation is provided in which a targeted, spatially selective cleaning of organically contaminated elements in column 10 and/or in vacuum sample chamber 20 is performed in the manner described above.

In this context, it is provided that in column 10 and/or in vacuum sample chamber 20, a plurality of light sources 15.1 to 15.5 are distributed spatially, via which the photodissociation of the supplied gas or ozone ($O_3$) is caused, and which are able to be switched on and off selectively with respect to time via control unit 30. To that end, in the exemplary embodiment illustrated, light sources 15.1 to 15.5 are in each case located adjacent to elements in column 10 of the particle beam apparatus which are prone to organic contamination. For example, light source 15.1 is placed near diaphragm 13.1, light source 15.2 is placed near electrostatic deflector electrodes 14.1 and 14.2, etc. The placement of five light sources 15.1 to 15.5 adjacent to specific diaphragms 13.1, 13.2 and deflector electrodes 14.1 to 14.6 illustrated in FIG. 1 should be understood to be merely exemplary, that is, a greater or smaller number of light sources 15.1 to 15.5 may also be provided in column 10 and/or also in vacuum sample chamber 20. In addition, they may also be placed at different locations in column 10 and/or in vacuum sample chamber 20 which are susceptible to contamination. In the case of vacuum sample chamber 20, for example, they may be beam detectors or passive elements which are inclined in this manner.

In the immediate vicinity of the contaminated elements in column 10 and/or in vacuum sample chamber 20, it is possible in this manner to activate the ozone stream by irradiation with ultraviolet radiation, and to generate in locally targeted fashion a sufficiently large quantity of oxygen radicals ($O^-$), which then react with the organic contaminants on the corresponding elements to form the different volatile degradation products carbon dioxide ($CO_2$) and water ($H_2O$). A further result of the placement of light sources 15.1 to 15.5 in the immediate vicinity of the pertinent elements or in areas of column 10 and/or vacuum sample chamber 20 is that molecules in the contamination layers may be excited or activated directly by the UV radiation and may thereby oxidize even more easily via the oxygen radicals ($O^-$), and thus be removed. In the process, some organic molecules may even be dissociated by the mere irradiation with ultraviolet light to form volatile molecules, and be pumped off.

In this exemplary embodiment of the particle beam apparatus, LEDs (light emitting diodes), which emit in the ultraviolet spectral range between 200 nm and 300 nm, for example, may be used as light sources 15.1 to 15.5 in column 10. In this context, LEDs based on aluminum nitride may be suitable. Such LEDs have service lives which, given cleaning times in the range of a few hours per month, considerably exceed the service life of the corresponding particle beam apparatus. In the range of approximately 250 nm, ozone ($O_3$) in particular absorbs ultraviolet radiation especially well, and may thereby easily be dissociated into oxygen molecules ($O_2$) and oxygen radicals ($O^-$).

The use of LEDs is considered advantageous because of the compactness of these light sources 15.1 to 15.5, since including the requisite electrical leads, they may be placed without difficulty at the necessary locations in column 10 and/or in vacuum sample chamber 20, without collision problems resulting with other components present in column 10 and/or in vacuum sample chamber 20. In this manner, it is also possible to ensure that primarily the elements especially prone to contamination are able to be selectively irradiated, while other elements possibly more sensitive to radiation, such as, for example, cable insulations, are shielded from the emitted UV radiation.

Moreover, light sources 15.1 to 15.5 in the form of LEDs may also be utilized without greater risk in the vacuum of column 10 and/or vacuum sample chamber 20, without having to fear greater danger for the vacuum system of the overall system.

On the other hand, if conventional UV light sources, such as, for example, mercury-vapor lamps were used, problems would result with regard to their suitable placement in column 10 and/or in vacuum sample chamber 20, since they are considerably larger. In addition, there is the risk that if such light sources are destroyed, the vacuum system of the overall system could become unusable because of a resulting mercury contamination.

As a further advantage of the use of light sources 15.1 to 15.5 in the wavelength range indicated, it should be stated that in general, metal surfaces in column 10 and/or in vacuum sample chamber 20 are thereby attacked less strongly than if even shorter-wave radiation were used, via which, for example, oxygen could be split directly.

In the cleaning operation, it is possible via control unit 30 to purposefully switch on and subsequently switch off individual light sources over a specific period of time, that is, to switch them on and off selectively with respect to time. This may mean, for instance, that individual light sources 15.1 to 15.5 in a specific area of column 10 and/or in vacuum sample chamber 20 are switched on for a certain period of time, and the dissociation of the ozone gas stream, and therefore the locally selective cleaning of components results only in this area. For example, only the two light sources 15.4, 15.5 in the lower column area could be switched on for a certain period of time, for instance, in order to especially clean the particularly contaminated deflector electrodes 14.5, 14.6 and diaphragm 13.2, etc. In principle, however, it is also possible to switch on all light sources 15.1 to 15.5 simultaneously in case of need.

As mentioned above, control unit 30 not only acts as explained on light sources 15.1 to 15.5, but is also in operative connection with controllable inlet valve 3. It is thereby possible, at proper pump power of pump 5, to selectively set the gas pressure of the photodissociatable gas or ozone ($O_3$) in column 10 and/or in vacuum sample chamber 20. In turn, the reach of the cleaning effect of the cleaning method described may be adjusted via the gas pressure, since due to collisions in the gas as a function of the pressure, the density of the oxygen radicals ($O^-$) produced decreases exponentially with the distance from the location of the radical generation.

Via control unit 30 and its possibility to influence inlet valve 3 and therefore the gas pressure in column 10 and/or in vacuum sample chamber 20 on one hand, as well as the capability of light sources 15.1 to 15.5 to be switched on and off selectively thereby possible on the other hand, contaminations in various areas of column 10 and/or in vacuum sample chamber 20 may therefore be eliminated particularly purposefully and efficiently in the cleaning operation. To that end, sets of parameters for the optimal cleaning of specific spatial areas in column 10 and/or vacuum sample chamber 20 of the particle beam apparatus may be stored in control unit 30 for the respective areas. In this context, such a set of parameters includes at least the selection of specific light sources 15.1 to 15.5 that must be switched on for this purpose, as well as a specific gas pressure in column 10 and/or in vacuum sample chamber 20 determined as optimal for a local cleaning of this area. Furthermore, a period of time may also be added for each selected light source 15.1 to 15.5, during which it is ideally switched on. In this manner, optimized cleaning of differently contaminated areas of column 10 and/or of vacuum sample chamber 20 of the particle beam apparatus is therefore possible. As a general principle, individual light sources 15.1 to 15.5 are activated timewise as a function of the contamination in the vicinity of respective light source 15.1 to 15.5, that is, as a rule, the greater the contamination of the element or the area to be cleaned in column 10 and/or vacuum sample chamber 20, the longer the corresponding light source(s) is/are switched on.

Figure 2:
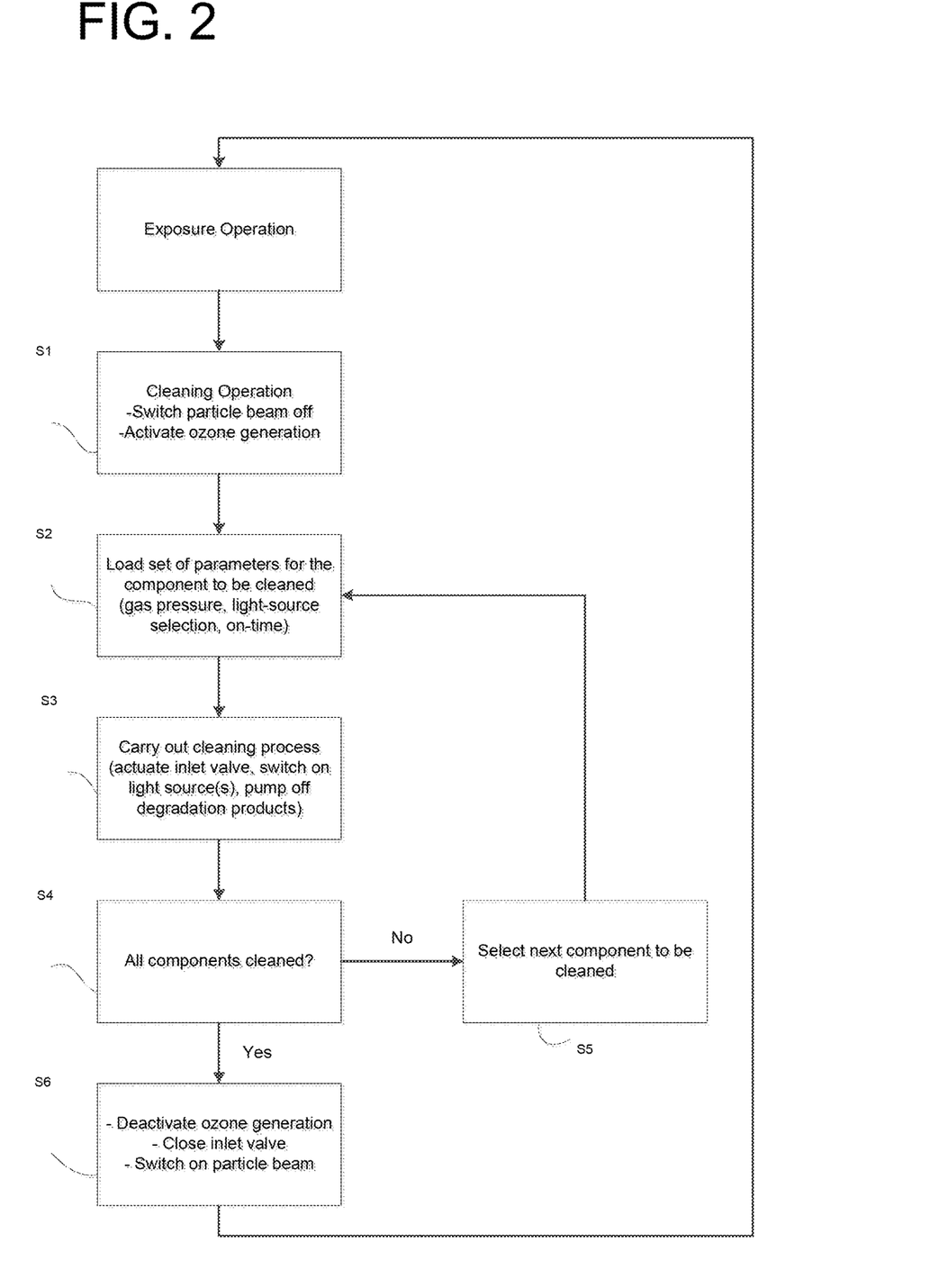
FIG. 2 is a flowchart that illustrates a method according to an example embodiment of the present invention.

A method for operating a particle beam apparatus is explained with reference to the flowchart of FIG. 2.

Thus, in case of need, a changeover is made from the exposure operation in which, with the aid of the particle beam and the particle-beam optical system located in the column, a desired pattern is exposed on a substrate in the vacuum sample chamber, to the cleaning operation in order to clean contaminated elements in the column and/or in the vacuum sample chamber. In so doing, in the first method step S1 of the cleaning operation, first of all, the particle beam is switched off and the ozone generation is activated. If getter-ion pumps should possibly be present in the system, at this point, it may be provided to switch them off as well in the cleaning operation, in order to avoid damage to these pumps. Subsequently in method step S2, the set of parameters for the selected element to be cleaned in the column and/or in the vacuum sample chamber, thus, e.g., a specific diaphragm, is loaded. This set of parameters includes the selection of a defined gas pressure in the column and/or in the vacuum sample chamber, the selection of one or possibly several light sources in the vicinity of the corresponding element, as well as possibly the on-time(s) for this/these light source(s). In this connection, the corresponding optimal set of parameters for the element in question has been determined beforehand. In following method step S3, the actual cleaning operation is performed. In the process, the inlet valve is suitably actuated in order to admit ozone under low pressure into the column, the light source(s) is/are switched on over the desired period of time, and the degradation products resulting from the oxidation of the contamination layers are pumped off. In subsequent method step S4, it is then checked whether all contaminated elements in the column and/or in the vacuum sample chamber are cleaned. If this is not the case, in method step S5, the next element is selected and method steps S2 to S4 are performed again, in so doing it being necessary to select the set of parameters suitably optimized for the cleaning of this element. If all contaminated elements or areas in the column and/or in the vacuum sample chamber are finally cleaned in this manner, in method step S6, the ozone generation is deactivated or switched off, the inlet valve is closed, and the particle beam and possibly the getter-ion pumps are switched on again, in order to then operate the particle beam apparatus in the conventional exposure operation again.

Incidentally, after such a cleaning process, the column of the particle beam apparatus may be evacuated very quickly again, and put into operation. This is possible since no aeration of the column up to the ambient pressure is necessary in the cleaning operation, and also no moist ambient air is able to penetrate into the column. The need for an otherwise necessary bake-out of elements in ultra-high vacuum areas of the column such as the particle beam source, for instance, may thus be eliminated.

The cleaning process may be performed both at regular intervals or else as needed, for example, when great drifts of the particle beam occur during exposure operation. It is also possible to use the corresponding cleaning method when the column must be aerated and open for other reasons, e.g., for the exchange of a column component. Using the method described herein, organic contaminants on elements in the column and/or in the vacuum sample chamber may be degraded quickly and selectively, as well.

In addition to the cleaning of the column and/or the vacuum sample chamber, it is possible to selectively switch on the UV light sources during the evacuation process after an aeration operation, as well, since the out-gassing behavior of certain materials in the column and/or in the vacuum sample chamber may thereby be accelerated. In this manner, the standstill time of the particle beam apparatus may thus additionally be reduced via the light sources provided in the column and/or in the vacuum sample chamber primarily for the cleaning operation.

A particle beam apparatus according to another example embodiment of the present invention is explained with reference to FIG. 3. Only substantial differences from the first exemplary embodiment are discussed below; otherwise, this exemplary embodiment corresponds to the first exemplary embodiment explained in more detail above.

Figure 3:
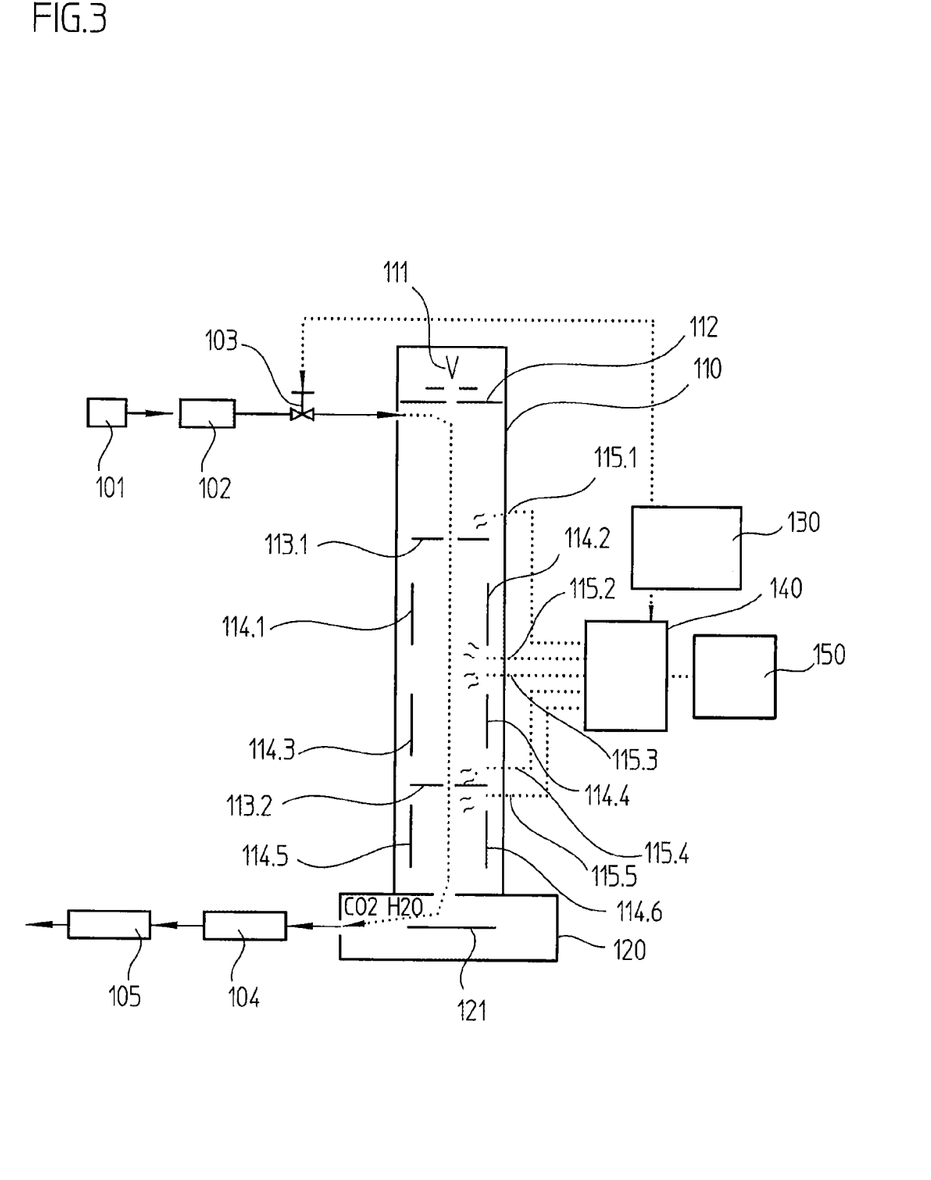
FIG. 3 schematically illustrates a particle beam apparatus according to an example embodiment of the present invention.

The exemplary embodiment illustrated in FIG. 3 differs primarily in the formation of the plurality of light sources 115.1 to 115.5 in electron-optical column 110 of the particle beam apparatus illustrated in FIG. 1. Light sources 115.1 to 115.5 take the form of exit areas of a fiber bundle having a plurality of light-conducting fibers, and are distributed spatially in column 110. At the other end of the fiber bundle is a single central light source 150 which emits ultraviolet radiation in the wavelength range between 200 nm and 300 nm and couples this radiation selectively into individual light-conducting fibers. To that end, located between light source 150 and the plurality of light-conducting fibers is a fiber-optic switching unit 140, designed, for example, in a conventional manner and illustrated only schematically, in the form of a fiber-optic multiplexer, which is able to be actuated via control unit 130 to switch individual light-conducting fibers, and therefore light sources 115.1 to 115.5 in column 110, on and off selectively with respect to time.

The exit areas of the individual light-conducting fibers are arranged, analogous to the LED light sources in the exemplary embodiment above, in the vicinity of those elements or areas in column 110 of the particle beam apparatus that are prone to organic contamination and are able to be cleaned via the method described in the cleaning operation. It may also be provided in this exemplary embodiment to place the exit areas of the individual light-conducting fibers adjacent to elements susceptible to contamination in vacuum sample chamber 120.

As indicated above, in addition to electron beam apparatuses, it is also possible to form other particle beam systems without departing from the spirit and scope hereof.

In addition, other photodissociatable gases may also be used, for whose activation, in particular, suitable LEDs or light-conducting fibers or fiber-optic switching units, etc., are available,

What is claimed is:

1. A particle beam apparatus, comprising:
   a column including a particle-beam optical system adapted to generate a particle beam to expose a desired pattern in a vacuum sample chamber during an exposure operation;
   a gas-feed system adapted to feed a regulable gas stream having a photodissociatable gas to the column and/or the vacuum sample chamber during a cleaning operation;
   a plurality of light sources distributed spatially in the column and/or in the vacuum sample chamber and adapted to photodissociate the gas during the cleaning operation; and
   a control unit connected to the light sources and adapted to selectively switch on and off individual light sources with respect to time during the cleaning operation;
   wherein the control unit is adapted to selectively switch on and off at least one light source with respect to time during the cleaning operation independently of selectively switching on and off at least one other light source with respect to time during the cleaning operation.

2. The particle beam apparatus according to claim 1, wherein the control unit is operatively connected with an inlet valve of the gas-feed system, and is adapted to set, in defined manner by acting on the inlet vale, a gas pressure in the column and/or in the vacuum sample chamber during the cleaning operation.

3. The particle beam apparatus according to claim 2, wherein, for each defined spatial area of the column and/or of the vacuum sample chamber, a set of parameters is stored in the control unit, the set of parameters including parameters necessary for optimal cleaning of the respective area, and the set of parameters including at least a selection of at least one light source, on-times of the light source, and a specific gas pressure in the column and/or in the vacuum sample chamber.

4. The particle beam apparatus according to claim 1, wherein the vacuum sample chamber is operatively connected with a vacuum pump to pump off degradation products resulting from a reaction of photodissociation products with contaminants, and wherein, between the vacuum sample chamber and the vacuum pump, a conversion unit is arranged, the conversion unit adapted to break down residues of the photodissociatable gas that are still present in an evacuated gas stream.

5. The particle beam apparatus according to claim 1, further comprising a particle-beam source arranged in the column, and a protective diaphragm arranged in front of the particle-beam source and adapted to protect the particle-beam source from a back-diffusion of photodissociation products.

6. The particle beam apparatus according to claim 1, wherein each of the light sources in the column and/or in the vacuum sample chamber is located adjacent to a component that is prone to organic contamination.

7. The particle beam apparatus according to claim 1, wherein the light sources include LEDs that emit light in an ultraviolet spectral range between 200 nm and 300 nm.

8. The particle beam apparatus according to claim 1, wherein the light sources are formed as exit areas of a fiber bundle having a plurality of light-conducting fibers, and are distributed spatially in the column and/or in the vacuum sample chamber, and at the other end of the fiber bundle, a light source is arranged, via which light is coupled into individual light-conducting fibers of the fiber bundle, and between the light source and the light-conducting fibers, at least one fiber-optic switching unit is arranged that is operable via the control unit to switch individual light-conducting fibers on and off selectively with respect to time.

9. The particle beam apparatus according to claim 1, further comprising:
   outside of the column, an oxygen reservoir and an ozone generator adapted to generate ozone from the oxygen reservoir as the photodissociatable gas and to feed the ozone to the column via the gas-feed system;

wherein, by interaction between radiation emitted by the light sources and the ozone, oxygen radicals result as photodissociation products that react with contaminants to form degradation products that are able to be pumped off.

10. A method for operating a particle beam apparatus having a column that includes a particle-beam optical system adapted to expose a desired pattern in a vacuum sample chamber during an exposure operation, comprising:
during a cleaning operation for cleaning the column and/or the vacuum sample chamber, feeding a regulable gas stream, having a photodissociatable gas, via a gas-feed system to the column and/or the vacuum sample chamber;
during the cleaning operation, photodissociating the gas with the aid of a plurality of light sources distributed spatially in the column and/or in the vacuum sample chamber, by selectively switching individual light sources on and off selectively with respect to time via a control unit connected to the light sources;
generating, by an ozone generator from an oxygen reservoir, ozone as the photodissociatable gas, the ozone generator and the oxygen reservoir being located outside of the column, and feeding the ozone to the column via the gas-feed system, to form, by interaction between radiation emitted by the light sources and the ozone, oxygen radicals as photodissociation products that react with contaminants to form degradation products that are able to be pumped off; and
selectively switching on and off at least one light source with respect to time during the cleaning operation independently of selectively switching on and off at least one other light source with respect to time during the cleaning operation.

11. The method according to claim 10, wherein the control unit is operatively connected with an inlet valve of the gas-feed system, and during the cleaning operation, the control unit acts on the inlet valve such that gas pressure in the column and/or in the vacuum sample chamber is set in a defined manner.

12. The method according to claim 10, wherein during the cleaning operation, the control unit activates individual light sources over time as a function of soiling in a vicinity of the respective light source.

13. The method according to claim 10, further comprising switching off the particle beam during the cleaning operation.

14. The method according to claim 10, further comprising pumping off, via a vacuum pump, the degradation products resulting from a reaction of the photodissociation products with the contaminants.

15. The method according to claim 14, further comprising breaking down residues of the photodissociatable gas that are still present in an evacuated gas stream.

16. The particle beam apparatus according to claim 1, wherein the particle beam apparatus is adapted to perform a method that includes:
during the cleaning operation for cleaning the column and/or the vacuum sample chamber, feeding the regulable gas stream, having the photodissociatable gas, via the gas-feed system to the column and/or the vacuum sample chamber; and
during the cleaning operation, photodissociating the gas with the aid of the plurality of light sources distributed spatially in the column and/or in the vacuum sample chamber, by selectively switching individual light sources on and off selectively with respect to time via the control unit connected to the light sources.

17. The method according to claim 10, wherein the particle-beam optical system is adapted to generate a particle beam to expose the desired patter in the vacuum sample chamber during the exposure operation, the particle beam apparatus including the gas-feed system, the plurality of light sources, and the control unit;
wherein the gas-feed system is adapted to feed the regulable gas stream having the photodissociatable gas to the column and/or the vacuum sample chamber during the cleaning operation;
wherein the plurality of light sources distributed spatially in the column and/or in the vacuum sample chamber are adapted to photodissociate the gas during the cleaning operation; and
wherein the control unit connected to the light sources is adapted to selectively switch on and off individual light sources with respect to time during the cleaning operation.

18. A particle beam apparatus, comprising:
a column including a particle-beam optical system adapted to generate a particle beam to expose a desired pattern in a vacuum sample chamber during an exposure operation;
a gas-feed system adapted to feed a regulable gas stream having a photodissociatable gas to the column and/or the vacuum sample chamber during a cleaning operation;
a plurality of light sources distributed spatially in the column and/or in the vacuum sample chamber and adapted to photodissociate the gas during the cleaning operation;
a control unit connected to the light sources and adapted to selectively switch on and off individual light sources with respect to time during the cleaning operation; and
outside of the column, an oxygen reservoir and an ozone generator adapted to generate ozone from the oxygen reservoir as the photodissociatable gas and to feed the ozone to the column via the gas-feed system;
wherein, by interaction between radiation emitted by the light sources and the ozone, oxygen radicals result as photodissociation products that react with contaminants to form degradation products that are able to be pumped off;
wherein the control unit is adapted to selectively switch on and off at least one light source with respect to time during the cleaning operation independently of selectively switching on and off at least one other light source with respect to time during the cleaning operation; and
wherein the particle beam apparatus is adapted to perform a method that includes:
during the cleaning operation for cleaning the column and/or the vacuum sample chamber, feeding the regulable gas stream, having the photodissociatable gas, via the gas-feed system to the column and/or the vacuum sample chamber; and
during the cleaning operation, photodissociating the gas with the aid of the plurality of light sources distributed spatially in the column and/or in the vacuum sample chamber, by selectively switching individual light sources on and off selectively with respect to time via the control unit connected to the light sources.

19. The particle beam apparatus according to claim 18, wherein the method includes selectively switching on and off at least one light source with respect to time during the cleaning operation independently of selectively switching on and off at least one other light source with respect to time during the cleaning operation.

\* \* \* \* \*